(12) United States Patent
Jinno et al.

(10) Patent No.: US 12,196,389 B2
(45) Date of Patent: Jan. 14, 2025

(54) HEAT DISSIPATION STRUCTURE, MANUFACTURING METHOD THEREFOR, AND VACUUM VALVE

(71) Applicant: Mitsubishi Electric Corporation, Tokyo (JP)

(72) Inventors: Katsuya Jinno, Tokyo (JP); Motoki Masaki, Tokyo (JP); Sohei Samejima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 328 days.

(21) Appl. No.: 17/778,001

(22) PCT Filed: Apr. 13, 2020

(86) PCT No.: PCT/JP2020/016318
§ 371 (c)(1),
(2) Date: May 19, 2022

(87) PCT Pub. No.: WO2021/210048
PCT Pub. Date: Oct. 21, 2021

(65) Prior Publication Data
US 2022/0412533 A1    Dec. 29, 2022

(51) Int. Cl.
*H01H 33/662* (2006.01)
*F21S 41/141* (2018.01)
(Continued)

(52) U.S. Cl.
CPC ........... *F21S 45/47* (2018.01); *F21S 41/141* (2018.01); *F21V 29/503* (2015.01); *F28F 13/18* (2013.01); *H01H 33/662* (2013.01)

(58) Field of Classification Search
CPC ....... H01H 33/662; H01H 33/66; F21S 45/47; F21S 41/141; F21S 41/192; F21S 41/25;
(Continued)

(56) References Cited

U.S. PATENT DOCUMENTS 3,668,350 A * 6/1972 Takeuchi ......... H01H 33/66207
                                                    200/266
9,709,348 B2 * 7/2017 Cheng ..................... F28F 21/02
(Continued)

FOREIGN PATENT DOCUMENTS

CN         206225277    *  6/2017   ............. H01H 33/66
EP      202010017443    *  6/2012   ............. H05K 7/209
(Continued)

OTHER PUBLICATIONS

Translation of CN206225277 (Original document published Jun. 6, 2017). (Year: 2017).*
(Continued)

*Primary Examiner* — William A Bolton
(74) *Attorney, Agent, or Firm* — XSENSUS LLP

(57) ABSTRACT

In a vacuum valve, as a heat dissipation structure thereof, a heat dissipation layer is provided to a part of the surface of each of a fixed conductor and a movable conductor which are a heat generation part, and a radiation heat absorption layer is provided to an insulation cylinder so as to be opposed to the heat dissipation layer. The heat dissipation layer and the radiation heat absorption layer are each formed from a ceramic having a high emissivity. Heat generated at the fixed conductor and the movable conductor is radiated by the heat dissipation layer, to be absorbed by the radiation heat absorption layer, and then radiated to the outside of the vacuum valve from the radiation heat absorption layer and a ceramic layer.

15 Claims, 5 Drawing Sheets

(51) Int. Cl.
*F21S 45/47* (2018.01)
*F21V 29/503* (2015.01)
*F28F 13/18* (2006.01)

(58) Field of Classification Search
CPC ..... F21S 41/285; F21S 41/143; F21V 29/503; F28F 13/18; H05B 47/00; H05B 45/00; H05K 7/20
USPC .................................. 218/134, 138, 139, 136
See application file for complete search history.

(56) References Cited

U.S. PATENT DOCUMENTS

| | | | |
|---|---|---|---|
| 10,102,989 B2* | 10/2018 | Hartmann | H01H 33/662 |
| 2012/0164438 A1* | 6/2012 | Chang | C23C 18/1254 |
| | | | 427/523 |
| 2012/0270034 A1* | 10/2012 | Chueh | H01L 23/3731 |
| | | | 252/71 |
| 2014/0166257 A1* | 6/2014 | Liu | F28F 21/081 |
| | | | 165/185 |
| 2016/0138750 A1* | 5/2016 | Nishikawa | B32B 3/04 |
| | | | 428/69 |
| 2017/0067702 A1* | 3/2017 | Suwa | F28F 13/18 |
| 2017/0347493 A1* | 11/2017 | Arai | H05K 9/0026 |

FOREIGN PATENT DOCUMENTS

| | | |
|---|---|---|
| JP | 58-187934 U | 12/1983 |
| JP | 59-4141 U | 1/1984 |
| JP | 2005-150429 A | 6/2005 |
| JP | 2011-96482 A | 5/2011 |
| JP | 2013-4708 A | 1/2013 |

OTHER PUBLICATIONS

Translation of DE202010017443 (original document published Jun. 6, 2012). (Year: 2012).*
International Search Report and Written Opinion mailed on Jul. 14, 2020, received for PCT Application PCT/JP2020/016318, Filed on Apr. 13, 2020, 10 pages including English Translation.

* cited by examiner

HEAT DISSIPATION STRUCTURE, MANUFACTURING METHOD THEREFOR, AND VACUUM VALVE

CROSS-REFERENCE TO RELATED APPLICATION

The present application is based on PCT filing PCT/JP2020/016318, filed Apr. 13, 2020, the entire contents of which is incorporated herein by reference.

TECHNICAL FIELD

The present disclosure relates to a heat dissipation structure, a manufacturing method therefor, and a vacuum valve.

BACKGROUND ART

In a vacuum device such as a vacuum circuit breaker, or a sealed device such as an LED headlight or a power module, it is necessary to efficiently dissipate heat generated inside a housing, and to suppress the temperature of the device to be not higher than an allowable temperature. In particular, with respect to a vacuum valve in a vacuum circuit breaker, in association with realization of high voltage and large current, the heat generation amount has been increased, and thus, there are increasing needs to improve heat dissipation characteristics.

Conventionally, heat generated at a vacuum valve is conducted to the outside of the vacuum valve through a metal conductor, and is dissipated by a cooling fin made of metal (see FIG. 3). A vacuum circuit breaker having a plurality of vacuum valves is provided with a plurality of cooling fins on the outside thereof, in order to release heat generated at each vacuum valve to the outside. An LED headlight is also provided with a cooling fin for dissipating heat generated at a light source (see FIG. 7).

In Patent Document 1, in order to improve the withstand voltage performance of a vacuum valve, electrode covers and electrode rod covers made of metal are provided so as to surround electrodes and electrode rods, and insulation coats such as oxide films or ceramic coats are provided on the surfaces thereof. Further, in the example of this Patent Document, copper coats are provided on the inner surfaces of the electrode covers and the electrode rod covers, to diffuse heat of the electrodes and electrode rods, thereby improving conductivity.

CITATION LIST

Patent Document

Patent Document 1: Japanese Laid-Open Patent Publication No. 2011-96482

SUMMARY OF THE INVENTION

Problems to be Solved by the Invention

However, in a conventional structure in which heat generated in a vacuum valve is dissipated by a cooling fin, the size of the cooling fin is increased in association with realization of high voltage and large current, thus causing increase in size of the device. In the case of an LED headlight as well, there is a problem that the device is increased in size due to provision of a cooling fin.

In the vacuum valve disclosed in Patent Document 1, a gap is present between an electrode and an electrode cover, and thus, heat of the electrode is difficult to be conducted to the ceramic coat. In addition, in a vacuum atmosphere, heat is more insulated by a gap than in an air atmosphere.

The present disclosure discloses a technology for solving the problem described above. An object of the present disclosure is to provide a heat dissipation structure and a manufacturing method therefor that can efficiently dissipate heat generated inside a housing. Another object of the present disclosure is to improve the heat dissipation characteristics of the vacuum valve, to realize both of high performance such as realization of high voltage and large current, and reduction in size.

Solution to the Problems

A heat dissipation structure according to the present disclosure is used in a device that has a heat generation part inside a housing. The heat dissipation structure includes: a heat dissipation layer processed into a shape extending along at least a part of a surface of the heat generation part, the heat dissipation layer having the shape in a state of a single body, the heat dissipation layer being integrated with the heat generation part by a joining material; and a radiation heat absorption layer provided to the housing so as to be opposed to the heat dissipation layer. The heat dissipation layer and the radiation heat absorption layer are each formed from a ceramic or a resin.

A manufacturing method for a heat dissipation structure according to the present disclosure is a manufacturing method for a heat dissipation structure to be used in a device that has a heat generation part inside a housing. The manufacturing method includes: processing a resin, or a burned body or molded body of a ceramic, and forming a heat dissipation layer in a shape extending along at least a part of a surface of the heat generation part; and joining and integrating the heat dissipation layer and the heat generation part together by using a joining material.

A vacuum valve according to the present disclosure includes: a vacuum container in which a fixed flange and a movable flange are fixed to both end portions of an insulation cylinder; a fixed conductor provided so as to penetrate the fixed flange; a movable conductor movably provided so as to penetrate the movable flange; and contacts provided to respective end portions, opposed to each other, of the fixed conductor and the movable conductor. A heat dissipation layer is provided to a part of a surface of each of the fixed conductor and the movable conductor, and a radiation heat absorption layer is provided to the insulation cylinder so as to be opposed to the heat dissipation layer, the radiation heat absorption layers forming a portion including the both end portions of the insulation cylinder. The heat dissipation layer and the radiation heat absorption layers are each formed from a ceramic, and in the insulation cylinder, an arc shield made of metal is disposed in an intermediate portion sandwiched by the radiation heat absorption layers, and the arc shield is exposed in an inner-side portion that is opposed to the contacts.

Effect of the Invention

According to the heat dissipation structure of the present disclosure, heat generated in the heat generation part is radiated by the heat dissipation layer, is absorbed by the radiation heat absorption layer provided so as to be opposed to the heat dissipation layer, and then is radiated to the outside of the housing. Therefore, heat generated inside the housing can be efficiently dissipated.

According to the manufacturing method for the heat dissipation structure of the present disclosure, a heat dissipation layer formed of ceramic can be formed for the heat generation part.

According to the vacuum valve of the present disclosure, heat generated at the fixed conductor and the movable conductor is radiated by the heat dissipation layer, is absorbed by the radiation heat absorption layer provided to the insulation cylinder so as to be opposed to the heat dissipation layer, and then, is radiated to the outside of the vacuum container. Therefore, heat generated inside the vacuum container can be efficiently dissipated. Since heat can be efficiently dissipated when compared with a conventional vacuum valve provided with a cooling fin, both of reduction in size and realization of high performance such as realization of high voltage and large current can be attained.

Objects, features, aspects, and effects of the present disclosure other than the above will become more apparent from the following detailed description with reference to the drawings.

DESCRIPTION OF EMBODIMENTS

Embodiment 1

Figure 1:
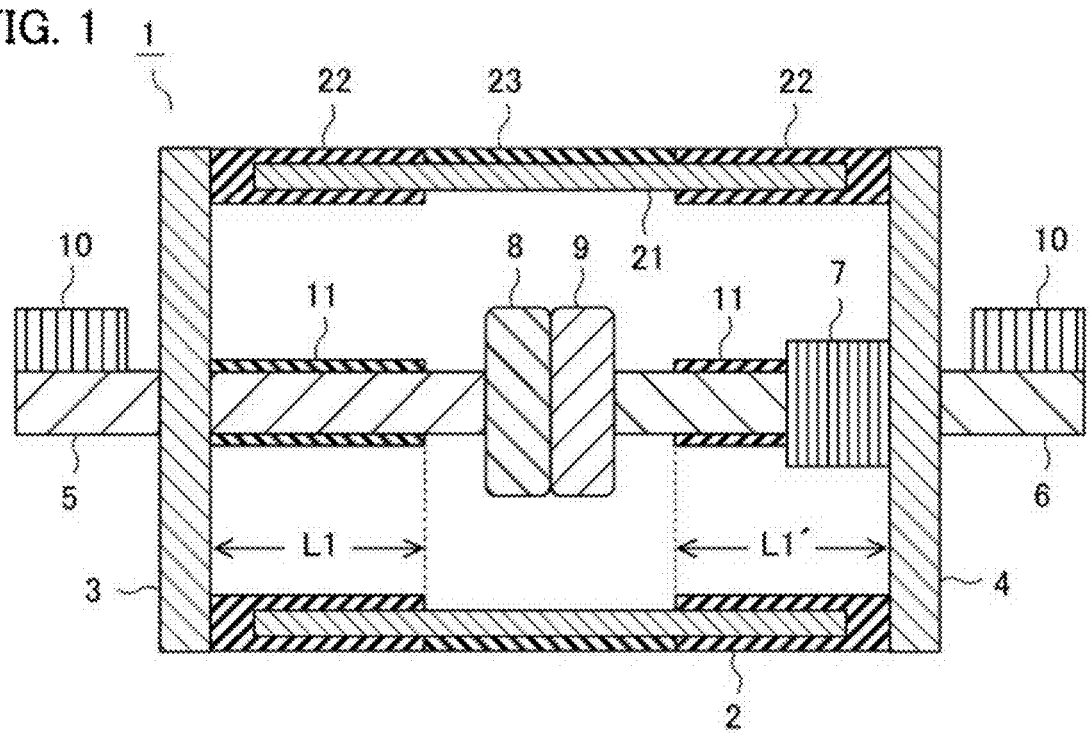
FIG. 1 is a cross-sectional schematic diagram showing a heat dissipation structure of a vacuum valve in embodiment 1.
Figure 2:
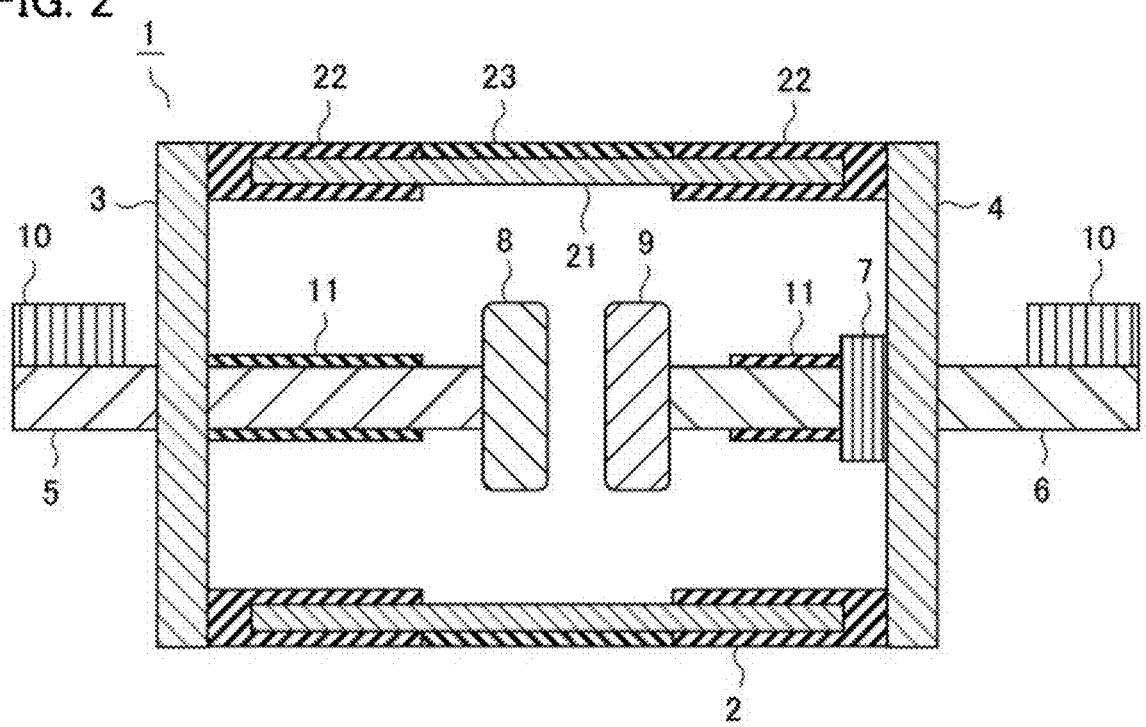
FIG. 2 is a cross-sectional schematic diagram showing the heat dissipation structure of the vacuum valve in embodiment 1.
Figure 3:
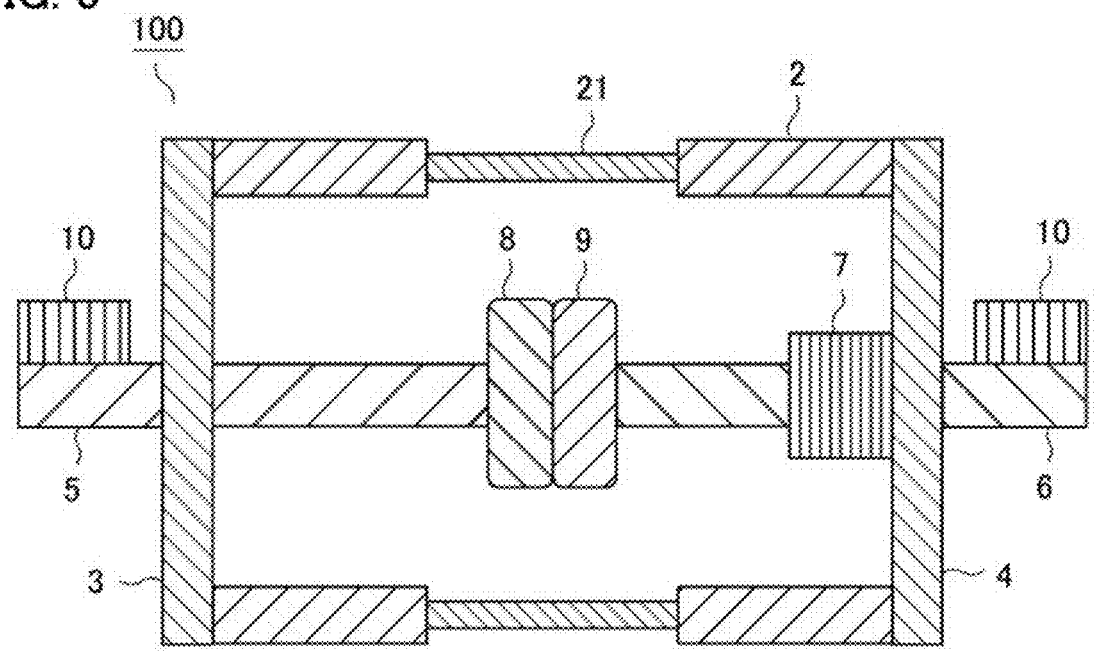
FIG. 3 is a cross-sectional schematic diagram showing a heat dissipation structure of a conventional vacuum valve.

In embodiment 1, using a vacuum valve as an example of a device in which the inside of a housing is in a vacuum atmosphere, a heat dissipation structure thereof is described with reference to the drawings. FIG. 1 and FIG. 2 show a heat dissipation structure of a vacuum valve in embodiment 1. FIG. 1 shows a state in which contacts of the vacuum valve are closed, and FIG. 2 shows a state where the contacts of the vacuum valve are open. FIG. 3 shows a structure of a conventional vacuum valve. In the drawings, the same or corresponding parts are denoted by the same reference characters.

As shown in FIG. 1 and FIG. 2 a vacuum valve 1 includes an insulation cylinder 2, a fixed flange 3, a movable flange 4, a fixed conductor 5, a movable conductor 6, a bellows 7, a fixed contact 8, and a movable contact 9. A vacuum container being a housing includes the insulation cylinder 2 in a cylindrical shape, and the fixed flange 3 and the movable flange 4 which are fixed by brazing to both end portions of the insulation cylinder 2. In an intermediate portion of the insulation cylinder 2, an arc shield 21 being a metal in a tubular shape is disposed.

The fixed conductor 5 is provided so as to penetrate the fixed flange 3, and is mounted to the fixed flange 3 by brazing. The movable conductor 6 penetrates the movable flange 4 and is joined by brazing to the movable flange 4 via the bellows 7 such that the movable conductor 6 is movable in the axial direction.

Contacts are provided at respective end portions, opposed to each other, of the fixed conductor 5 and the movable conductor 6. That is, the fixed contact 8 is joined by brazing to the end portion of the fixed conductor 5, and the movable contact 9 is joined by brazing to the end portion of the movable conductor 6. The movable conductor 6 is driven by a drive device (not shown) provided outside the vacuum valve 1, and the bellows 7 contracts/expands, whereby the contacts are opened/closed.

In the vacuum valve 1, when the contacts are closed and energized as shown in FIG. 1, the fixed conductor 5, the movable conductor 6, the fixed contact 8, and the movable contact 9, which are inside the vacuum container, serve as a heat generation part, and when an abnormality has occurred in the power system, the contacts are opened and interruption is realized as shown in FIG. 2.

The heat dissipation structure of the vacuum valve 1 in embodiment 1 includes: a heat dissipation layer 11 directly or indirectly joined to the heat generation part; and a radiation heat absorption layer 22 provided to the insulation cylinder 2 being a part of the vacuum container, so as to be opposed to the heat dissipation layer 11. Specifically, as shown in FIG. 1, the heat dissipation layer 11 formed from a ceramic is provided to a part of the surface of each of the fixed conductor 5 and the movable conductor 6.

The heat dissipation layer 11 is provided so as to adhere to a part of the surface of each of the fixed conductor 5 and the movable conductor 6 such that heat generated at the fixed conductor 5 and the movable conductor 6 is efficiently radiated. In a vacuum atmosphere, heat is more insulated by a gap than in an air atmosphere. Therefore, when a gap is present between each electrode rod and the corresponding heat dissipation layer 11, the heat dissipation characteristics are decreased.

In the insulation cylinder 2, the radiation heat absorption layers 22 each formed from a ceramic are disposed at both end portions of the insulation cylinder 2, and the arc shield 21 made of metal is disposed in the vicinity of an intermediate portion sandwiched by the radiation heat absorption layers 22. The arc shield 21 is in contact with the fixed flange 3 and the movable flange 4 via the insulation cylinder 2, and thus, can maintain insulation.

The radiation heat absorption layers 22 are provided so as to be opposed to the heat dissipation layers 11, and absorb heat radiated by the heat dissipation layers 11. Meanwhile, the arc shield 21 is exposed in an inner-side portion, of the insulation cylinder 2, that is opposed to the fixed contact 8 and the movable contact 9. A ceramic layer 23 being an insulation layer that covers the arc shield 21 may be provided on the outer side of the intermediate portion of the insulation cylinder 2. Provision of the ceramic layer 23 increases the efficiency of dissipating heat absorbed by the radiation heat absorption layers 22 to the outside of the vacuum valve 1.

In FIG. 1, L1 represents the distance from the fixed flange 3 to an end of the heat dissipation layer 11, and L1' represents the distance from the movable flange 4 to an end of the heat dissipation layer 11. The range in which the heat dissipation layer 11 is provided at each electrode rod, i.e., the L1, L1', is not limited in particular. However, the greater the L1, L1' is, the higher the cooling performance due to radiation becomes.

Meanwhile, when the contacts are opened/closed, the temperature in the vicinity of the fixed contact 8 and the movable contact 9 rapidly increases. In particular, when the contacts are opened, an atmosphere of a high temperature and a high electric field is caused. Therefore, there is a risk that the heat dissipation layers 11 are damaged due to a thermal shock, to be scattered in the vacuum valve 1. In order to prevent this, the range L1, L1' in which the heat dissipation layer 11 is provided is determined in consideration of the shapes of the fixed contact 8 and the movable contact 9, the electric field dependent on applied voltage, the heat amount, the temperature, and the like.

The range in which each radiation heat absorption layer 22 is provided is not limited in particular, but preferably, is not less than the range in which the radiation heat absorption layer 22 is opposed to the heat dissipation layer 11. The arc shield 21 made of metal has a lower emissivity and a higher reflectivity than that made of ceramic, and thus, reflects, without absorbing, heat radiated by the heat dissipation layer 11. Therefore, it is preferable that the heat dissipation layer 11 is not opposed to the arc shield 21.

When, in the inner-side portion, of the insulation cylinder 2, that is opposed to the fixed contact 8 and the movable contact 9, the radiation heat absorption layer 22 is not provided and the arc shield 21 is exposed, it is possible to prevent an arc from being generated at the time of opening/closing of the contacts.

According to the heat dissipation structure as described above, heat generated at the fixed conductor 5 and the movable conductor 6 is radiated by the heat dissipation layers 11 provided to the surfaces of the fixed conductor 5 and the movable conductor 6, and is absorbed by the radiation heat absorption layers 22 provided so as to be opposed to the heat dissipation layers 11. The heat absorbed by the radiation heat absorption layers 22 is conducted to the arc shield 21, and the temperature thereof is made uniform, and then, the resultant heat is radiated to the outside of the vacuum valve 1 from the radiation heat absorption layers 22 and the ceramic layer 23.

Next, as a comparative example, a heat dissipation structure of a conventional vacuum valve is described with reference to FIG. 3. A conventional vacuum valve 100 includes a cooling fin 10 made of metal at each of a fixed conductor 5 and a movable conductor 6 outside a vacuum container. Heat generated at the fixed conductor 5 and the movable conductor 6 is conducted in the corresponding electrode rods to move to the outside of the vacuum container, and then is air-cooled by the cooling fins 10.

In contrast to this, the vacuum valve 1 according to embodiment 1 includes a heat dissipation mechanism based on radiation in addition to heat dissipation by means of the cooling fins 10. In the case of the conventional heat dissipation structure, heat generated due to realization of high performance is cooled only by the cooling fins 10. This causes increase in size of the cooling fins 10 and increase in size of the vacuum valve associated therewith. In contrast, in the present invention, since the heat dissipation mechanism based on radiation is provided, increase in size of the cooling fins 10 can be suppressed. Therefore, both of realization of high performance and reduction in size can be attained.

Figure 4:
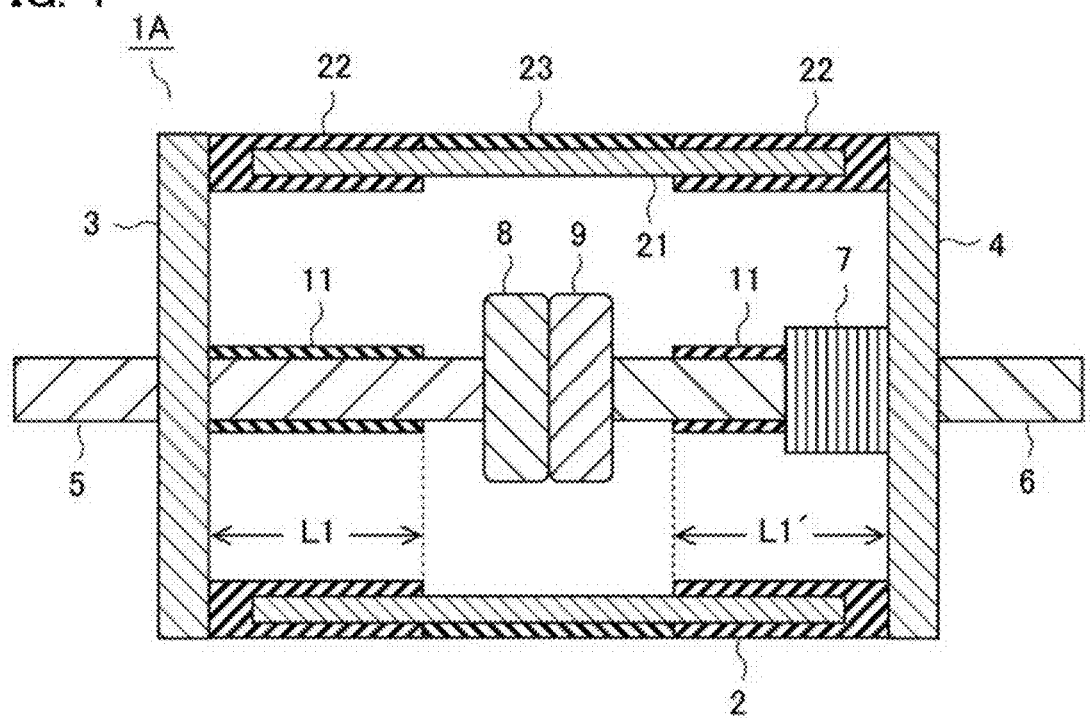
FIG. 4 is a cross-sectional schematic diagram showing a modification of the heat dissipation structure of the vacuum valve in embodiment 1.

However, as a modification of the vacuum valve 1 according to embodiment 1, when the heat dissipation layers 11 and the radiation heat absorption layers 22 are provided as in a vacuum valve 1A shown in FIG. 4 and the heat dissipation characteristics are sufficient, a structure in which the cooling fins 10 are not provided to the electrode rods outside the vacuum container may be adopted.

As a material for each heat dissipation layer 11, each radiation heat absorption layer 22, and the insulation layer (the ceramic layer 23) at the outer-side surface of the arc shield 21, a ceramic having a high emissivity is used. The emissivity represents ease of heat radiation from an object, in terms of a scale from 0 to 1.

Specifically, the ceramic includes at least one of aluminium oxide, titanium oxide, chromium oxide, silicon oxide, glass, silicon nitride, silicon carbide, zirconium dioxide, mullite, steatite, forsterite, cordierite, and aluminium nitride. These may be used individually, or two or more kinds thereof may be used in combination. From the viewpoints of processability and cost, aluminium oxide is suitable.

As an example of a device having a vacuum atmosphere, a vacuum valve has been described herein. However, when the device having a vacuum atmosphere is not a vacuum valve, as a material for the heat dissipation layer 11, the radiation heat absorption layer 22, and the insulation layer at the outer-side surface of the arc shield 21, a resin having a high emissivity may be used. Specifically, the resin includes at least one of polycarbonate, polypropylene, polyvinyl alcohol, acryl, epoxy, phenol, polyvinyl chloride, polystyrene, unsaturated polyester, polyimide, and acrylonitrile-butadiene-styrene copolymer. These may be used individually, or two or more kinds thereof may be used in combination. Alternatively, a fiber-reinforced plastic using any one or more of these resins as a base material may be used.

In the case of a vacuum valve, the materials for the heat dissipation layer 11 and the radiation heat absorption layer 22 are limited to the ceramic. However, in the case of not being a vacuum valve, the heat dissipation layer 11 and the radiation heat absorption layer 22 are each formed from the ceramic or the resin, and the combination thereof can be made as desired. When both of the heat dissipation layer 11 and the radiation heat absorption layer 22 are formed from the ceramic, the same ceramic may be used or different ceramics may be used. This also applies to a case where both of the heat dissipation layer 11 and the radiation heat absorption layer 22 are formed from the resin. The heat dissipation layer 11 may be formed from the ceramic and the radiation heat absorption layer 22 may be formed from the resin, or vice versa.

As a manufacturing method for the heat dissipation structure of the vacuum valve 1, a method in which the heat dissipation layer 11 is formed at a part of the surface of each of the fixed conductor 5 and the movable conductor 6 is described. As one method, there is a method in which a ceramic burned body or molded body is processed into a shape that extends along an electrode rod. When a lump of a burned ceramic is processed, a processing tool using a diamond, etc., is used. When a ceramic molded body before being burned is processed, such a ceramic molded body is softer than a burned body and is easy to be processed. However, ceramics shrink when burned, and thus, when a ceramic molded body before being burned is processed, dimensional accuracy is decreased when compared with a case where a burned body is processed.

Then, the heat dissipation layer 11 having been processed is integrated with each electrode rod by using a joining material made of metal, for example. When no joining material is used, heat conduction is hindered by a minute gap between the heat dissipation layer 11 and the electrode rod. Therefore, it is better to cause the heat dissipation layer 11 and the electrode rod to adhere to each other by using a joining material. The kind of the joining material made of metal is not limited in particular.

As another method, ceramic coating can also be used. As the ceramic coating, there are a sol-gel process that includes a step of applying a ceramic precursor solution to the electrode rod being a heat generation part, and a step of making the ceramic precursor solution into a ceramic through sintering, to form the heat dissipation layer 11, a method that uses a glaze, and the like.

In the case of the ceramic coating, it is preferable to perform, as a pre-process, sand blasting that forms ruggedness on the surface of the electrode rod. Then, degreasing washing is performed, the ceramic precursor solution is uniformly applied by spray for example, predrying is performed at 100° C., and then, main burning is performed at 300° C. In a case where the heat dissipation layer 11 is partially formed, the region where the heat dissipation layer 11 is not to be formed is masked by a masking tape when the ceramic precursor solution is applied.

The heat dissipation layer 11 formed through ceramic coating is bonded, without any gap, to the electrode rod due to the anchor effect according to the ruggedness provided to the electrode rod, and thus, there is no need to use a joining material. The method for providing ruggedness to the surface of the electrode rod is not limited to sand blasting. When adhesion is ensured, ruggedness may not necessarily be provided. Further, as a method for enhancing the adhesion, a chemical method or a physical method may be used.

As a material for ceramic coating, for example, a material whose main component is silicon may be used, and aluminium oxide particles may be added for increasing strength, or particles such as those of titanium dioxide or a copper oxide may be added for coloring. The addition of particles is not limited thereto, and is performed as appropriate in order to change physical properties of the film. Further, a method in which the surface of the electrode rod is oxidized as in anodic oxidation, a method in which a ceramic layer is deposited through a process using plasma, or the like may be used. When the heat dissipation layer 11 is formed from the resin, well-known methods such as a method in which a lump of the resin is processed, coating, and painting can be used.

After the heat dissipation layer 11 has been formed on the fixed conductor 5 and the movable conductor 6 by the method as described above, members such as the fixed contact 8, the movable contact 9, the fixed flange 3, the movable flange 4, and the insulation cylinder 2 are joined by brazing, to manufacture the vacuum valve 1. Each radiation heat absorption layer 22 processed so as to suit the shape of the arc shield 21 is joined to the arc shield 21, and then, the ceramic layer 23 is attached, whereby the insulation cylinder 2 is made.

As described above, according to the heat dissipation structure of the vacuum valve 1 in embodiment 1, heat generated inside the vacuum container can be efficiency dissipated, and thus, both of realization of high performance and reduction in size can be attained. According to the manufacturing method for the heat dissipation structure in embodiment 1, the heat dissipation layer 11 formed of ceramic can be formed for each of the fixed conductor 5 and the movable conductor 6 which are a heat generation part.

Embodiment 2

Figure 5:
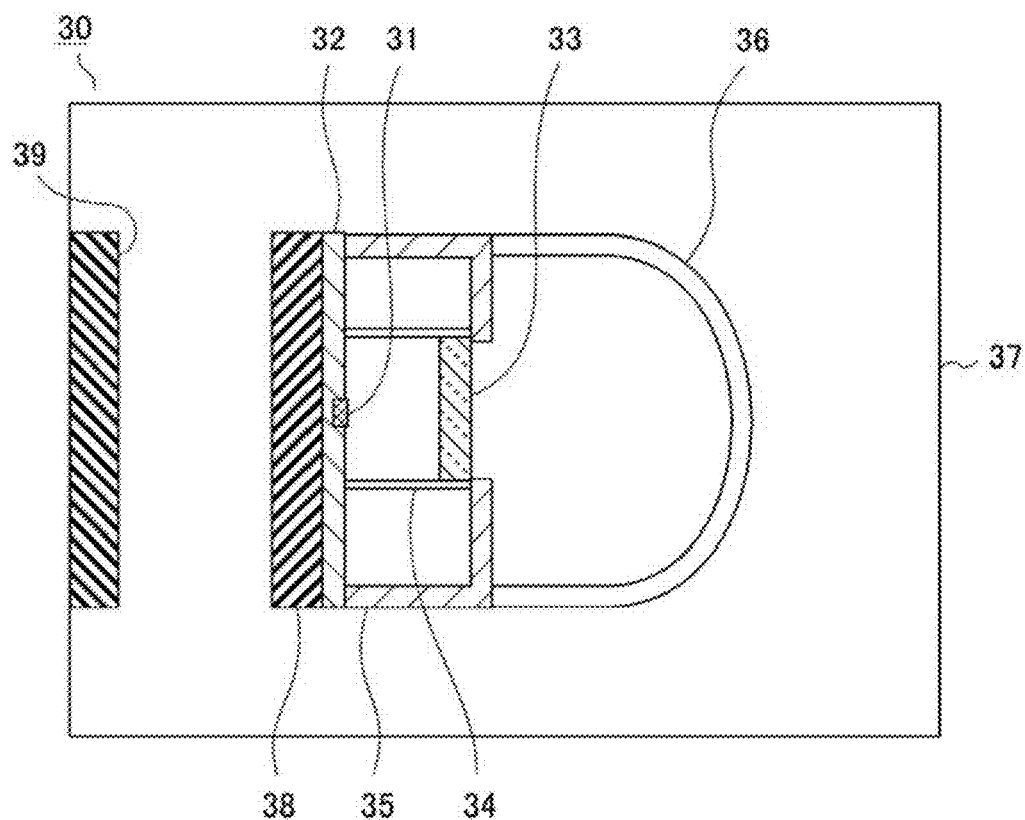
FIG. 5 is a cross-sectional schematic diagram showing a heat dissipation structure of an LED headlight in embodiment 2.
Figure 6:
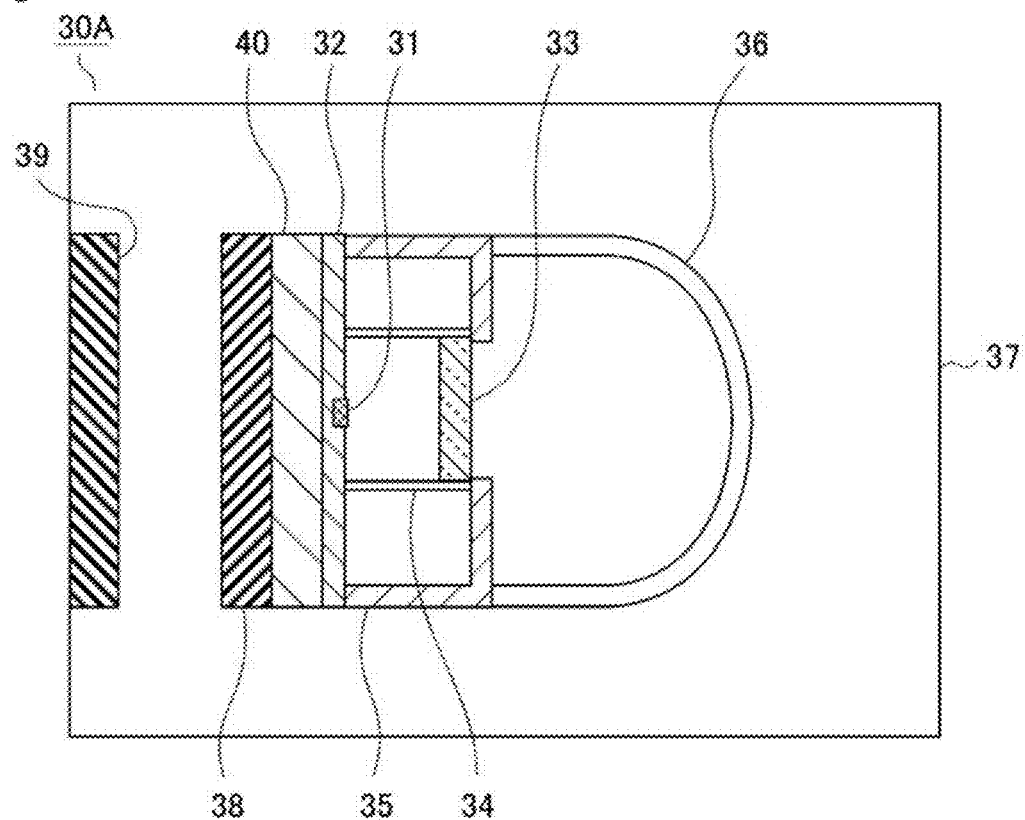
FIG. 6 is a cross-sectional schematic diagram showing a modification of the heat dissipation structure of the LED headlight in embodiment 2.
Figure 7:
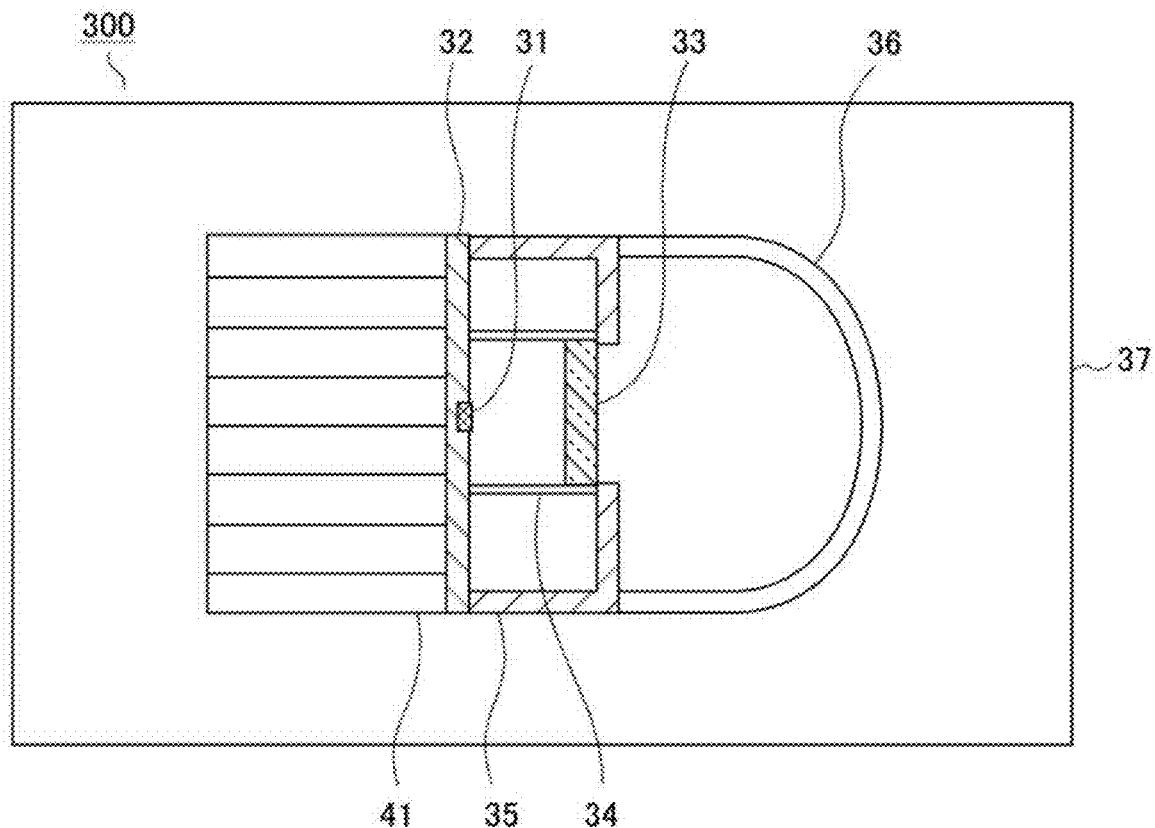
FIG. 7 is a cross-sectional schematic diagram showing a heat dissipation structure of a conventional LED headlight.

In embodiment 2, using an LED headlight as an example of a device in which the inside of a housing is in an air atmosphere, a heat dissipation structure thereof is described. FIG. 5 shows a heat dissipation structure of an LED headlight in embodiment 2, and FIG. 6 shows a modification of the heat dissipation structure of the LED headlight shown in FIG. 5. FIG. 7 shows a heat dissipation structure of a conventional LED headlight.

As shown in FIG. 5, an LED headlight 30 in embodiment 2 is a vehicle headlight using a light emitting diode (LED) as a light source 31. The LED headlight 30 includes a substrate 32 to which the light source 31 is mounted, a condenser lens 33, a holding member 34, a mounting member 35, a projector lens 36, and a housing 37.

The light source 31 is mounted to one face of the substrate 32. The condenser lens 33 is fixed to the holding member 34, and is opposed to the light source 31. The projector lens 36 is disposed to the front of the condenser lens 33 by the mounting member 35, and allows irradiation light of the light source 31 to pass therethrough. The inside of the housing 37 accommodating these components is in an air atmosphere. In FIG. 5, the cross-sectional shape of the housing 37 is depicted in a rectangle shape for simplification.

The heat dissipation structure of the LED headlight 30 in embodiment 2 is described. In the LED headlight 30, the light source 31 serves as a heat generation part. A heat dissipation layer 38 formed from a ceramic is provided to the face on the side opposite to the face, of the substrate 32, to which the light source 31 is mounted. That is, in embodiment 2, the heat dissipation layer 38 is indirectly joined to the heat generation part. The heat dissipation layer 38 is provided so as to adhere to a surface of the substrate 32. The method for joining the heat dissipation layer 38 is not limited in particular as long as the method does not hinder heat conduction. For example, a joining agent using a metal as a material is used. Since the atmosphere is an air atmosphere, even if fixation by screws is adopted, heat conduction is hardly hindered.

A radiation heat absorption layer 39 formed from a ceramic or a resin is provided on the inner side, of the housing 37, that is opposed to the heat dissipation layer 38. As a material for the housing 37, a metal, a resin, a ceramic, or the like is used. Although not limited in particular, when the material for the housing 37 is a resin or a ceramic, a structure in which the radiation heat absorption layer 39 is not provided may be adopted.

The range in which the radiation heat absorption layer 39 is provided is not limited in particular, but preferably, is not less than the range in which the radiation heat absorption layer 39 is opposed to the heat dissipation layer 38. When the housing 37 is made of metal, the housing 37 has a lower emissivity and a higher reflectivity than that made of ceramic, and thus, reflects, without absorbing, heat radiated by the heat dissipation layer 38. Therefore, it is preferable that the heat dissipation layer 38 is not opposed to the housing 37 when the housing 37 is made of metal.

According to the heat dissipation structure as described above, heat generated at the light source 31 is absorbed by the heat dissipation layer 38 via the substrate 32, and is radiated to the side opposite to the light source 31. The heat radiated by the heat dissipation layer 38 is absorbed by the radiation heat absorption layer 39 provided so as to be opposed to the heat dissipation layer 38, and is radiated to the outside from the housing 37.

As a material for the heat dissipation layer 38 and the radiation heat absorption layer 39, a ceramic or a resin having a high emissivity can be used, similar to embodiment 1 above. Specific examples of the ceramic and the resin have been described in embodiment 1 above. The method for forming the heat dissipation layer 38 is the same as that of embodiment 1 above, and thus, description thereof is omitted.

A method for assembling the LED headlight 30 is performed as follows, for example. The components are joined by a well-known method using screws, an adhesive, or the like. The condenser lens 33 held by the holding member 34 is mounted to the substrate 32 having the light source 31 mounted thereto, and then these are fixed by the mounting member 35. Subsequently, the projector lens 36 is mounted to the mounting member 35, and the heat dissipation layer 38 is provided to the substrate 32. Lastly, the assembled components are set inside the housing 37 to which the radiation heat absorption layer 39 has been provided, whereby the LED headlight 30 is completed.

In the case of the LED headlight 30, the size of the light source 31 is small relative to the size of the substrate 32, and the heat generation region is very small. Therefore, when the heat dissipation layer 38 having a low heat conductivity is directly provided to the substrate 32, a temperature distribution may be caused in the plane of the heat dissipation layer 38, whereby decrease in the heat dissipation characteristics may be caused.

Therefore, as a modification of the LED headlight 30 according to embodiment 2, a metal plate 40 may be disposed between the substrate 32 and the heat dissipation layer 38, as in an LED headlight 30A shown in FIG. 6. In the LED headlight 30A, heat released from the light source 31 becomes uniform in the plane of the metal plate 40, and then, is radiated from the heat dissipation layer 38. Accordingly, the heat dissipation characteristics are further improved. As a material for the metal plate 40, aluminum, copper, silver, or the like having a high heat conductivity is used. From the viewpoints of processability and cost, aluminum is preferable.

As a comparative example, a heat dissipation structure of a conventional LED headlight is described with reference to FIG. 7. A conventional LED headlight 300 includes, as a heat sink, a cooling fin 41 made of metal on the face on the side opposite to the face, of the substrate 32, to which the light source 31 is mounted. In contrast to this, the LED headlights 30, 30A in embodiment 2 do not include the cooling fin 41, and the height dimension of the heat dissipation layer 38 can be made smaller than the cooling fin 41.

According to the heat dissipation structures of the LED headlights 30, 30A in embodiment 2, heat generated inside the housing 37 can be efficiently dissipated, and the LED headlights 30, 30A can be reduced in size when compared with the conventional LED headlight 300 using the cooling fin 41. Therefore, according to embodiment 2, the LED headlights 30, 30A reduced in size can be obtained.

EXAMPLES

Vacuum valves according to Example 1 to Example 4 have adopted the heat dissipation structure of the vacuum valve according to the present disclosure. In Example 1 to Example 3, a heat dissipation layer (A) and a radiation heat absorption layer (B) shown in Table 1 correspond to the heat dissipation layer 11 and the radiation heat absorption layer 22 of the vacuum valve 1 (see FIG. 1) according to embodiment 1 above.

In Example 1 to Example 3, aluminium oxide, silicon nitride, and silicon carbide are respectively used as the heat dissipation layer (A), aluminium oxide is used as the radiation heat absorption layer (B), and the radiation heat absorption layer (B) is provided to the entire region of the opposing portion to the heat dissipation layer (A). As Comparative Example 1, a vacuum valve not provided with the heat dissipation layer (A) was prepared.

Figure 8:
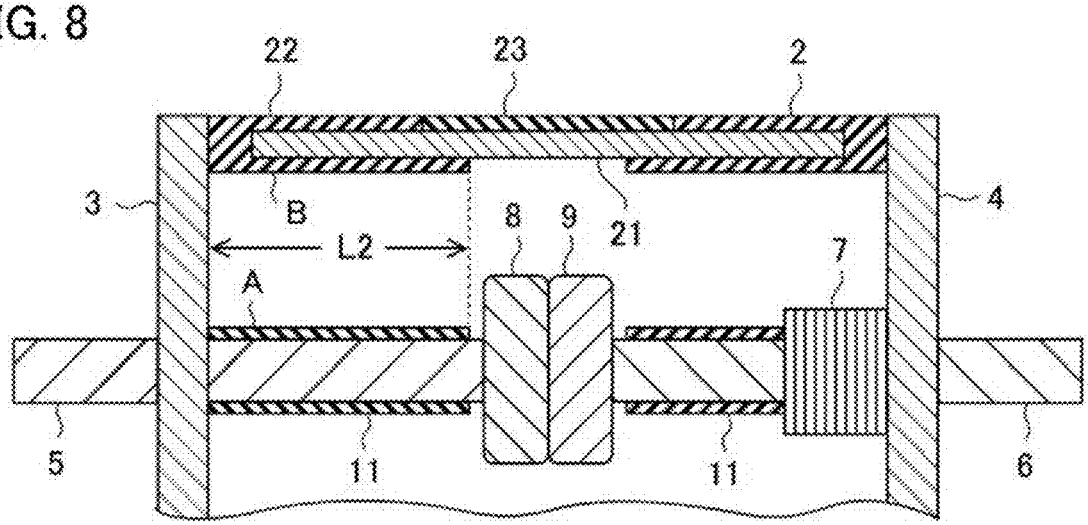
FIG. 8 is a cross-sectional schematic diagram showing a heat dissipation structure of a vacuum valve in Example 4.
Figure 9:
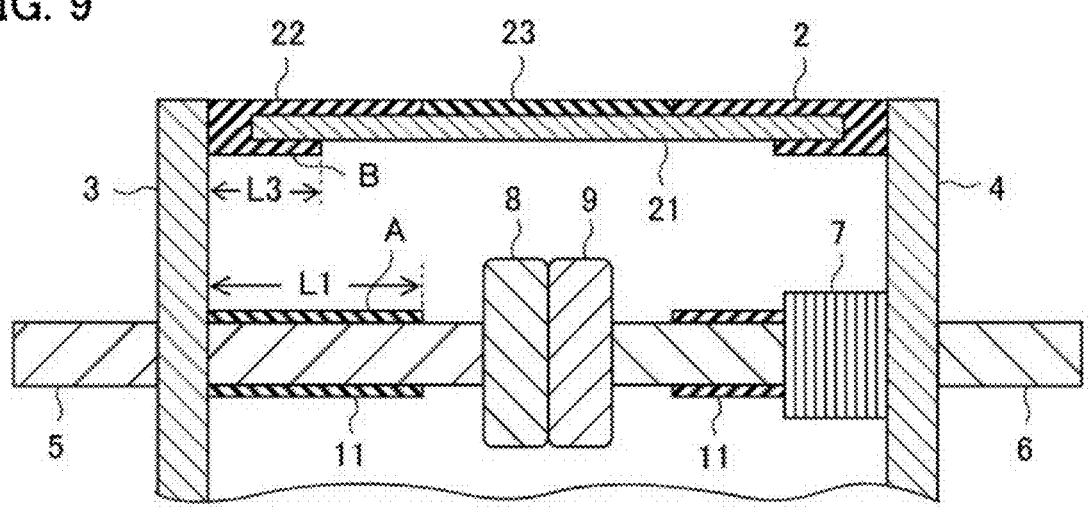
FIG. 9 is a cross-sectional schematic diagram showing a heat dissipation structure of a vacuum valve in Comparative Example 2.

FIG. 8 shows a heat dissipation structure of a vacuum valve according to Example 4, and FIG. 9 shows a heat dissipation structure of a vacuum valve according to Comparative Example 2. In Example 4 and Comparative Example 2, the range in which the heat dissipation layer (A) and the radiation heat absorption layer (B) are provided has been changed, when compared with Example 1. In Example 4, as shown in FIG. 8, the radiation heat absorption layer (B) is provided to the entire region of the opposing portion to the heat dissipation layer (A), and the range of the heat dissipation layer (A) and the radiation heat absorption layer (B) has been increased when compared with Example 1 (L2>L1).

Meanwhile, in Comparative Example 2, as shown in FIG. 9, the range (L1) of the heat dissipation layer (A) is similar to that in Example 1, but a range (L3) of the radiation heat absorption layer (B) in the opposing portion has been reduced to about half of L1 (L3<L1). Therefore, about half of the heat dissipation layer (A) is opposed to the arc shield 21 made of metal. In the vacuum valves of Example 1 to Example 4 and Comparative Example 2, the heat dissipation layer (A) is adhered to the fixed conductor 5 and the movable conductor 6, via a joining material made of metal.

With respect to the vacuum valves according to Example 1 to Example 4, Comparative Example 1, and Comparative Example 2, a test for examining a temperature increase suppressing effect was performed. The temperature inside the vacuum valve 1 needs to be measured with a through-hole provided to the fixed flange 3, and when a through-hole is provided, vacuum of the insulation cylinder 2 cannot be maintained. Therefore, in this test, the temperature was measured at a contact portion of the fixed conductor 5 and the fixed flange 3 outside the insulation cylinder 2. For measurement of the temperature, an optical fiber thermometer, a thermocouple, or the like can be used. From the viewpoint of non-concentration of electric fields, an optical fiber thermometer is preferable.

When the fixed contact 8 and the movable contact 9 are closed to be energized, the temperature gradually increases and then reaches a saturated state. In this test, an increased temperature being the difference between the temperature at the time of the saturated state and the temperature at the test start was measured. However, since the increased temperature changes depending on the condition such as the rated voltage and the current-carrying capacity, the numerical values of the test result this time are examples. Table 1 shows the test result.

TABLE 1

| | Heat dissipation layer (A) | Radiation heat absorption layer (B)/range | Note | Increased temperature (K) |
|---|---|---|---|---|
| Example 1 | Aluminium oxide | Aluminium oxide/ entire region of opposing portion to A | | 67 |
| Example 2 | Silicon nitride | Aluminium oxide/ entire region of opposing portion to A | | 71 |
| Example 3 | Silicon carbide | Aluminium oxide/ entire region of opposing portion to A | | 73 |
| Example 4 | Aluminium oxide | Aluminium oxide/ entire region of opposing portion to A | Range of A, B is greater than in Example 1 | 66 |
| Comparative Example 1 | None | — | | 96 |
| Comparative Example 2 | Aluminium oxide | Aluminium oxide/ half region of opposing portion to A (remaining half is arc shield made of metal) | Range of A is similar to that in Example 1. Range of B is half of that in Example 1 | 80 |

As shown in Table 1, the increased temperature in Example 1 in which aluminium oxide was used as the heat dissipation layer (A) was 67 K. The increased temperature in Example 2 in which silicon nitride was used was 71 K. The increased temperature in Example 3 in which silicon carbide was used was 73 K. In contrast to this, the increased temperature in Comparative Example 1 in which no heat dissipation layer was provided was 96 K. In each of Example 1 to Example 3, temperature increase was suppressed. In Example 1 in which aluminium oxide was used, temperature decrease of 29 K was observed with respect to Comparative Example 1, and temperature increase was most suppressed. In each of Example 1, Example 4, and Comparative Example 2, aluminium oxide was used as the heat dissipation layer (A). As in Example 1 and Example 4, when the radiation heat absorption layer (B) was provided in the entire region of the opposing portion to the heat dissipation layer (A), temperature increase was more suppressed than when no heat dissipation layer was provided (Comparative Example 1). In Example 4 as well in which the range in which the heat dissipation layer (A) and the radiation heat absorption layer (B) were provided was larger than in Example 1, difference in the increased temperature was not observed.

Meanwhile, as in Comparative Example 2, in a case where the range of the radiation heat absorption layer (B) is smaller than that in Example 1, and the range in which the arc shield 21 made of metal is exposed on the inner side of the insulation cylinder 2 is large, the temperature increase suppressing effect was small. A conceivable cause of this is that the arc shield 21 opposed to the heat dissipation layer (A) reflects, without absorbing, heat radiated by the heat dissipation layer (A).

Next, examples and comparative examples of the heat dissipation structure of the LED headlight are described. Example 5 to Example 9 have adopted the heat dissipation structure of the LED headlight according to the present disclosure. In Example 5 to Example 8, as the heat dissipation layer 38 of the LED headlight 30 (see FIG. 5) according to embodiment 2 above, aluminium oxide, silicon nitride, silicon carbide, and polycarbonate were respectively used, and the height dimension of each heat dissipation layer 38 was set to 5 mm.

In Example 5 to Example 8, as the radiation heat absorption layer 39 provided to the opposing portion to the heat dissipation layer 38, aluminium oxide was used. In Example 9, aluminium oxide was used as the heat dissipation layer 38, and polycarbonate was used as the radiation heat absorption layer 39.

As Comparative Example 3, an LED headlight provided with the conventional cooling fin 41 (see FIG. 7) made of metal and not provided with the heat dissipation layer 38 and the radiation heat absorption layer 39 was prepared. The height dimension of the cooling fin 41 was 11 mm. Further, as Comparative Example 4, an LED headlight in which aluminium oxide was used as the heat dissipation layer 38 and that was not provided with the radiation heat absorption layer 39 was prepared. In Comparative Example 4, the opposing portion to the heat dissipation layer 38 is the housing 37 made of metal.

With respect to the LED headlights of Example 5 to Example 9, Comparative Example 3, and Comparative Example 4, a test for examining a temperature increase suppressing effect was performed. When the LED headlight is lit, the temperature gradually increases and then reaches a saturated state. In this test, an increased temperature being the difference between the temperature at the time of the saturated state and the temperature at the test start was measured. For measurement of the temperature, an optical fiber thermometer, a thermocouple, or the like can be used. Table 2 shows the test result.

TABLE 2

| | Heat dissipation layer | Radiation heat absorption layer | Note | Increased temperature (K) |
|---|---|---|---|---|
| Example 5 | Aluminium oxide | Aluminium oxide | Height of heat dissipation layer: 5 mm | 100 |
| Example 6 | Silicon nitride | Aluminium oxide | Height of heat dissipation layer: 5 mm | 105 |
| Example 7 | Silicon carbide | Aluminium oxide | Height of heat dissipation layer: 5 mm | 108 |
| Example 8 | Polycarbonate | Aluminium oxide | Height of heat dissipation layer: 5 mm | 107 |
| Example 9 | Aluminium oxide | Polycarbonate | | 102 |
| Comparative Example 3 | None | None | Height of cooling fin: 11 mm | 106 |
| Comparative Example 4 | Aluminium oxide | None | Opposing portion to heat dissipation layer is metal housing | 121 |

As shown in Table 2, the increased temperature in Example 5 in which aluminium oxide was used as the heat dissipation layer 38 was 100 K, the increased temperature in Example 6 in which silicon nitride was used was 105 K, the increased temperature in Example 7 in which silicon carbide was used was 108 K, and the increased temperature in Example 8 in which polycarbonate was used was 107 K. In Example 5 in which aluminium oxide was used as the heat dissipation layer 38, the temperature increase was most suppressed.

The increased temperature in Comparative Example 3 in which the heat dissipation layer 38 and the radiation heat absorption layer 39 were not provided and the cooling fin 41 was provided was 106 K, and was similar to that in Example 6 to Example 8. However, since the height dimension of the cooling fin 41 is 11 mm, the LED headlight is increased in size when compared with a case where the heat dissipation layer 38 having a height dimension of 5 mm is used.

Although aluminium oxide was used as the heat dissipation layer 38 in each of Example 5, Example 9, and Comparative Example 4, the temperature increase was most suppressed in Example 5 in which aluminium oxide was also used as the radiation heat absorption layer 39. However, in Example 9 as well in which polycarbonate was used as the radiation heat absorption layer 39, an effect of a level similar to that in Example 1 was obtained. Meanwhile, in Comparative Example 4 in which the radiation heat absorption layer 39 was not provided and the opposing portion to the heat dissipation layer 38 was the housing 37 made of metal, the increased temperature was 121 K, which was the highest.

From the result above, in each of Example 1 to Example 4 in which the heat dissipation structure of the vacuum valve according to the present disclosure was adopted, and Example 5 to Example 9 in which the heat dissipation structure of the LED headlight according to the present disclosure was adopted, the temperature increase suppressing effect was able to be confirmed.

In the above embodiments and Examples, description was given while a vacuum valve is used as an example of a vacuum device in which the inside of the housing is in a vacuum atmosphere, and an LED headlight is used as an example of a device in which the inside of the housing is in an air atmosphere. However, the heat dissipation structure according to the present disclosure is not limited to these devices.

Although the present disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure. It is therefore understood that numerous modifications which have not been exemplified can be devised without departing from the scope of the specification of the present disclosure. For example, at least one of the constituent parts may be modified, added, or eliminated. At least one of the constituent parts mentioned in at least one of the preferred embodiments may be selected and combined with the constituent parts mentioned in another preferred embodiment.

DESCRIPTION OF THE REFERENCE CHARACTERS

1, 1A, 100 vacuum valve
2 insulation cylinder
3 fixed flange
4 movable flange
5 fixed conductor
6 movable conductor
7 bellows
8 fixed contact
9 movable contact
10, 41 cooling fin
11, 38 heat dissipation layer
21 arc shield
22, 39 radiation heat absorption layer
23 ceramic layer
30, 30A, 300 LED headlight
31 light source
32 substrate
33 condenser lens
34 holding member
35 mounting member
36 projector lens
37 housing
40 metal plate

The invention claimed is:

1. A heat dissipation structure to be used in a device that has a heat generation part inside a housing, the heat dissipation structure comprising:
   a heat dissipation layer processed into a shape extending along at least a part of a surface of the heat generation part, the heat dissipation layer having the shape in a state of a single body, the heat dissipation layer being integrated with the heat generation part by a joining material; and
   a radiation heat absorption layer provided to the housing so as to be opposed to the heat dissipation layer, wherein
   the heat dissipation layer and the radiation heat absorption layer are each formed from a ceramic or a resin, and
   the joining material is a metal material.

2. The heat dissipation structure according to claim 1, wherein the radiation heat absorption layer is provided on an inner side of the housing.

3. The heat dissipation structure according to claim 1, wherein the radiation heat absorption layer forms at least a part of the housing.

4. The heat dissipation structure according to claim 1, wherein
   the heat dissipation layer is formed from a ceramic, and the radiation heat absorption layer is formed from a ceramic or a resin.

5. The heat dissipation structure according to claim 4, wherein
   the ceramic includes at least one of aluminium oxide, titanium oxide, chromium oxide, silicon oxide, glass, silicon nitride, silicon carbide, zirconium dioxide, mullite, steatite, forsterite, cordierite, and aluminium nitride.

6. The heat dissipation structure according to claim 1, wherein
   the heat dissipation layer is formed form a resin, and the radiation heat absorption layer is formed from a ceramic or a resin.

7. The heat dissipation structure according to claim 6, wherein
   the resin includes at least one of polycarbonate, polypropylene, polyvinyl alcohol, acryl, epoxy, phenol, polyvinyl chloride, polystyrene, unsaturated polyester, polyimide, and acrylonitrile-butadiene-styrene copolymer.

8. The heat dissipation structure according to claim 6, wherein
   the resin is a fiber-reinforced plastic.

9. The heat dissipation structure according to claim 1, wherein
   inside of the housing is in a vacuum atmosphere.

10. The heat dissipation structure according to claim 1, wherein
    the device is a vacuum valve having, as a housing, a vacuum container in which a fixed flange and a movable flange are fixed to both end portions of an insulation cylinder, the device having, as the heat generation part, a fixed conductor provided so as to penetrate the fixed flange and a movable conductor movably provided so as to penetrate the movable flange, and the heat dissipation layer and the radiation heat absorption layer are each formed from a ceramic.

11. The heat dissipation structure according to claim 1, wherein inside of the housing is in an air atmosphere.

12. The heat dissipation structure according to claim 11, wherein the device is an LED headlight, and has, as the heat generation part, a light source mounted to a substrate, the heat dissipation layer is provided to a face on a side opposite to a face, of the substrate, to which the light source is mounted, and the radiation heat absorption layer is provided on an inner side of the housing so as to be opposed to the heat dissipation layer.

13. A manufacturing method for a heat dissipation structure to be used in a device that has a heat generation part inside a housing, the manufacturing method comprising:

processing a resin, or a burned body or molded body of a ceramic, and forming a heat dissipation layer in a shape extending along at least a part of a surface of the heat generation part; and joining and integrating the heat dissipation layer and the heat generation part together by using a joining material.

14. A vacuum valve comprising:

a vacuum container in which a fixed flange and a movable flange are fixed to both end portions of an insulation cylinder;

a fixed conductor provided so as to penetrate the fixed flange;

a movable conductor movably provided so as to penetrate the movable flange; and contacts provided to respective end portions, opposed to each other, of the fixed conductor and the movable conductor, wherein a heat dissipation layer is provided to a part of a surface of each of the fixed conductor and the movable conductor, and a radiation heat absorption layer is provided to the insulation cylinder so as to be opposed to the heat dissipation layer, the radiation heat absorption layers forming a portion including the both end portions of the insulation cylinder, the heat dissipation layer and the radiation heat absorption layers are each formed from a ceramic, and in the insulation cylinder, an arc shield made of metal is disposed in an intermediate portion sandwiched by the radiation heat absorption layers, and the arc shield is exposed in an inner-side portion that is opposed to the contacts.

15. The vacuum valve according to claim 14, wherein an insulation layer covering the arc shield is provided on an outer side of the intermediate portion of the insulation cylinder, and the insulation layer is formed from a ceramic.

* * * * *